(12) United States Patent
Kim

(10) Patent No.: US 7,668,020 B2
(45) Date of Patent: Feb. 23, 2010

(54) DATA INPUT CIRCUIT OF SEMICONDUCTOR MEMORY APPARATUS AND DATA INPUT METHOD USING THE SAME

(75) Inventor: Kwang Hyun Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 74 days.

(21) Appl. No.: 11/961,753

(22) Filed: Dec. 20, 2007

(65) Prior Publication Data

US 2008/0285364 A1    Nov. 20, 2008

(30) Foreign Application Priority Data

May 14, 2007    (KR)    .................... 10-2007-0046399

(51) Int. Cl.
*G11C 7/10* (2006.01)
(52) U.S. Cl. ............................. 365/189.05; 365/230.03; 365/230.06; 365/193; 365/233.1
(58) Field of Classification Search ............ 365/189.05, 365/230.03, 230.06, 193, 233.1
See application file for complete search history.

(56) References Cited

U.S. PATENT DOCUMENTS

| | | | | |
|---|---|---|---|---|
| 3,969,706 A | * | 7/1976 | Proebsting et al. ..... | 365/189.02 |
| 5,488,580 A | * | 1/1996 | Park ...................... | 365/189.15 |
| 5,912,899 A | | 6/1999 | Kim et al. | |
| 6,104,653 A | * | 8/2000 | Proebsting ............... | 365/203 |
| 6,275,441 B1 | * | 8/2001 | Oh ........................ | 365/189.18 |
| 6,445,606 B1 | * | 9/2002 | Khoury .................... | 365/96 |
| 6,728,162 B2 | * | 4/2004 | Lee et al. ................ | 365/233.1 |
| 6,785,168 B2 | * | 8/2004 | Yoon ...................... | 365/189.02 |
| 6,922,367 B2 | * | 7/2005 | Morzano et al. .......... | 365/193 |
| 7,054,221 B2 | * | 5/2006 | Shim ....................... | 365/193 |
| 7,317,629 B2 | * | 1/2008 | Lee ......................... | 365/51 |
| 7,362,619 B2 | * | 4/2008 | Morzano et al. .......... | 365/189.05 |

FOREIGN PATENT DOCUMENTS

| | | |
|---|---|---|
| JP | 11-144461 | 5/1999 |
| JP | 11-238399 | 8/1999 |
| JP | 2001-014845 | 1/2001 |
| JP | 2002-246891 | 8/2002 |
| JP | 2004-253072 | 9/2004 |
| KR | 1020010108786 A | 12/2001 |
| KR | 1020020041739 A | 6/2002 |

* cited by examiner

*Primary Examiner*—Viet Q Nguyen
(74) *Attorney, Agent, or Firm*—Baker & McKenzie LLP

(57) ABSTRACT

A data input circuit of a semiconductor memory apparatus includes a plurality of data input sense amplifiers, each of which amplifies input data in response to a data input strobe signal and generates amplified data, and a data selecting block that selectively outputs a plurality of amplified data in response to starting addresses.

23 Claims, 5 Drawing Sheets

DATA INPUT CIRCUIT OF SEMICONDUCTOR MEMORY APPARATUS AND DATA INPUT METHOD USING THE SAME

CROSS-REFERENCES TO RELATED APPLICATION

The present application claims priority to Korean Patent Application number 10-2007-0046399, filed on May 14, 2007, in the Korean Intellectual Property Office, the contents of which are incorporated herein by reference in their entirety.

BACKGROUND

1. Technical Field

The embodiments described herein relate to a semiconductor memory apparatus, and more particularly, to a data input circuit of a semiconductor memory apparatus and a data input method using the same.

2. Related Art

In general, a conventional semiconductor memory apparatus aligns a plurality of data bits, which are input in series, in parallel to each other by using a data input strobe signal, amplifies the data, and transmits the data to global Input/Output lines GIO. At this time, starting addresses determine global Input/Output lines to which data is transmitted among a plurality of global Input/Output lines. The starting addresses indicate some of the plurality-bit column addresses, and are used to select the global Input/Output lines.

A data input circuit included in a conventional semiconductor memory apparatus activates a plurality of data input sense amplifiers using a data input strobe signal and starting addresses. Each of the activated data input sense amplifiers amplifies data, which is allocated by the starting addresses among a plurality of data, and transmits the amplified data to a corresponding data input driver. Each of the plurality of data input drivers loads data transmitted by the corresponding data input sense amplifier to a corresponding global Input/Output line.

Since the general data input circuit uses a large number of signals, a large number of signal lines need to be provided in the data input circuit. As a result, the data input circuit occupies a large area.

FIG. 1 is a block diagram illustrating the structure of a data input circuit of a conventional semiconductor memory apparatus. In this case, a burst length is 4. Therefore, four data components are transmitted to four global Input/Output lines.

As shown in FIG. 1, the conventional data input circuit includes a data input strobing unit 10, first to fourth data input sense amplifiers 21 to 24, and first to fourth data input drivers 31 to 34.

In response to a data input strobe signal 'dinstb' and starting addresses 'add_start<1:4>', the data input strobing unit 10 generates first, second, third, and fourth strobing addresses 'add_str1<1:4>', 'add_str2<1:4>', 'add_str3<1:4>', and 'add_str4<1:4>', and first to fourth precharging addresses 'add_pcg<1:4>'.

In response to the first, second, third, and fourth strobing addresses 'add_str1<1>', 'add_str2<1>', 'add_str3<1>', and 'add_str4<1>', and the precharging address 'add_pcg<1>', the first data input sense amplifier 21 selectively amplifies the first, second, third, and fourth input data signals 'din1', 'din2', 'din3', and 'din4', and generates first amplified data signal 'damp1'.

In response to the first, second, third, and fourth strobing addresses 'add_str1<2>', 'add_str2<2>', 'add_str3<2>', and 'add_str4<2>', and the precharging address 'add_pcg<2>', the second data input sense amplifier 22 selectively amplifies the first, second, third, and fourth input data signals 'din1', 'din2', 'din3', and 'din4', and generates second amplified data signal 'damp2'.

In response to the first, second, third, and fourth strobing addresses 'add_str1<3>', 'add_str2<3>', 'add_str3<3>', and 'add_str4<3>', and the precharging address 'add_pcg<3>', the third data input sense amplifier 23 selectively amplifies the first, second, third, and fourth input data signals 'din1', 'din2', 'din3', and 'din4', and generates third amplified data signal 'damp3'.

In response to the first, second, third, and fourth strobing addresses 'add_str1<4>', 'add_str2<4>', 'add_str3<4>', and 'add_str4<4>', and the precharging address 'add_pcg<4>', the fourth data input sense amplifier 24 selectively amplifies the first, second, third, and fourth input data signals 'din1', 'din2', 'din3', and 'din4', and generates fourth amplified data signal 'damp4'.

The first to fourth data input drivers 31 to 34 are driven to transmit the first to fourth amplified data signals 'damp1' to 'damp4' and transmit them into the first to fourth global Input/Output lines GIO1 to GIO4, respectively.

In response to an enabled bit of the starting addresses 'add_start<1:4>' when the data input strobe signal 'dinstb' is enabled, the data input strobe unit 10 selectively enables one of the first, second, third, and fourth strobing addresses 'add_str1<1:4>', 'add_str2<1:4>', 'add_str3<1:4>', and 'add_str4<1:4>'. For example, when the starting address 'add_start<1>' is enabled, the first strobing addresses 'add_str1<1:4>' are enabled. Then, the first to fourth data input sense amplifiers 21 to 24 amplify the first to fourth input data 'din1' to 'din4'. When the starting addresses other than the starting address 'add_start<1>' are enabled, the strobing addresses other than the first strobing addresses 'add_str1<1:4>' are enabled. At this time, each of the first to fourth data input sense amplifiers 21 to 24 are allocated with a data combination different from a previous data combination. Each of the first to fourth data input sense amplifiers 21 to 24 amplifies an input data combination. Meanwhile, the precharching addresses 'add_pcg_<1:4>' are enabled with the data input strobe signal 'dinstb' being disabled, so that the first to fourth data input sense amplifiers 21 to 24 not to be activated.

The first to fourth data input driver 31 to 34 transmit the first to fourth amplified data 'damp1' to 'damp4', which are amplified by the first to fourth data input sense amplifiers 21 to 24, to the first to fourth global Input/Output lines GIO1 to GIO4, respectively. The first to fourth input data 'din1' to 'din4' are amplified and driven through the above-described process, and then transmitted to the first to fourth global Input/Output lines GIO1 to GIO4 in parallel.

It can be understood that the data input circuit having the above-described structure occupies a large area. For example, referring to FIG. 1, the number of output lines of the data input strobing unit 10 is 20. Each signal transmission line needs to have a predetermined insulated region in order to prevent noise between adjacent transmission lines. However, since the semiconductor memory apparatus includes a plurality of data input circuits, it can be understood that the data input circuits occupy a large area in the semiconductor memory apparatus.

SUMMARY

A data input circuit of a semiconductor memory apparatus that has improved area efficiency is described herein. A data input method using a data input circuit of a semiconductor memory apparatus that has improved area efficiency is also described herein.

In one aspect, a data input circuit is provided that includes a plurality of data input sense amplifiers, each of which can be configured to amplify input data in response to a data input strobe signal and to generate amplified data and a data selecting block that can be configured to selectively output a plurality of amplified data in response to starting addresses.

In another embodiment, a data input circuit is provided that includes a data input sense amplifier that can be configured to amplify input data in response to a data input strobe signal to generate amplified data, a plurality of data selecting blocks that can be configured to selectively output the amplified data in response to starting addresses, and a plurality of data input drivers that can be configured to drive a plurality of data components output from the plurality of data selecting blocks and transmits the data components to global Input/Output lines, wherein the data input sense amplifier can be configured to perform a precharge operation in response to the data input strobe signal.

In still another embodiment, a data input circuit is provided that includes a first data input sense amplifier that can be configured to amplify first input data in response to a data input strobe signal and to generate first amplified data, a second data input sense amplifier that can be configured to amplify second input data in response to the data input strobe signal and to generate second amplified data, a first data selecting block that can be configured to selectively output the first amplified data or the second amplified data in response to starting addresses, a second data selecting block that can be configured to selectively output the first amplified data or the second amplified data in response to the starting addresses, a first data input driver that can be configured to drive data transmitted from the first data selecting block and to transmit the data to a first global Input/Output line, and a second data input driver that can be configured to drive data transmitted from the second data selecting block and to transmit the data to a second global Input/Output line.

In still another aspect, a data input method is provided that includes amplifying a plurality of input data in response to a data input strobe signal and generating a plurality of amplified data, generating one data combination from the plurality of amplified data in response to starting addresses and driving the data combination, and transmitting the driven data combination through a global Input/Output line.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 2:
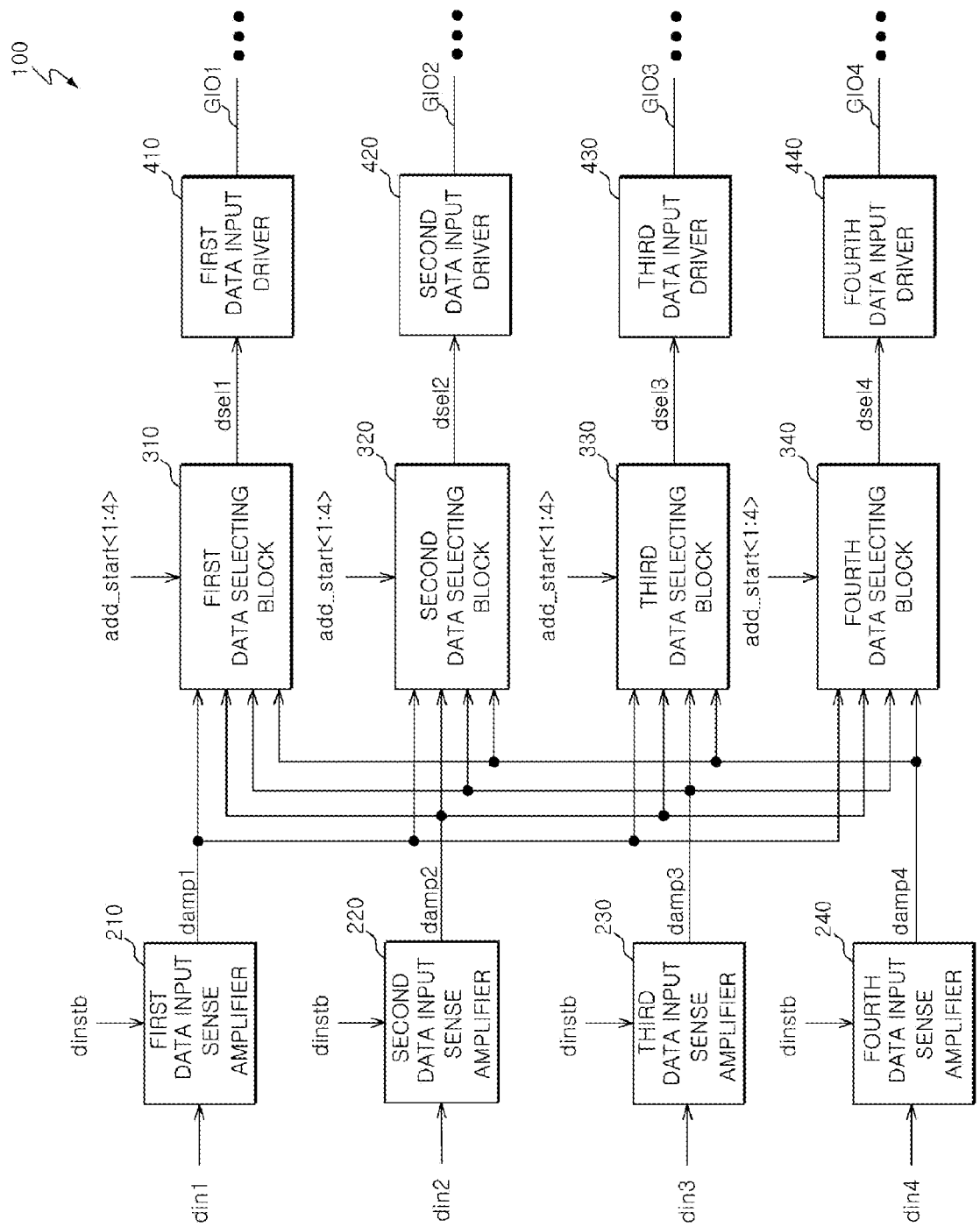
FIG. 2 is a block diagram illustrating the structure of a data input circuit of a semiconductor memory apparatus according to one embodiment.

FIG. 2 is a diagram illustrating the structure of a data input circuit 100 of a semiconductor memory apparatus according to one embodiment. In the example of FIG. 2, an example of a data input circuit 100 that transmits four data bits to four global Input/Output lines, respectively, is illustrated; however it will be understood that the apparatus and methods described herein are not necessarily limited to such a 4 bit implementation.

Referring to FIG. 2, it can be seen that the data input circuit 100 can include first to fourth data input sense amplifiers 210 to 240, first to fourth data selecting blocks 310 to 340, and first to fourth data input drivers 410 to 440.

Specifically, the first data input sense amplifier 210 can be configured to amplify first input data signal 'din1' in response to a data input strobe signal 'dinstb' to generate first amplified data signal 'damp1'. The second data input sense amplifier 220 can be configured to amplify second input data signal 'din2' in response to the data input strobe signal 'dinstb' to generate second amplified data signal 'damp2'. The third data input sense amplifier 230 can be configured to amplify third input data signal 'din3' in response to the data input strobe signal 'dinstb' to generate third amplified data signal 'damp3'. The fourth data input sense amplifier 240 can be configured to amplify fourth input data signal 'din4' in response to the data input strobe signal 'dinstb' to generate fourth amplified data signal 'damp4'.

In response to first to fourth starting addresses 'add_start<1:4>' the first to fourth data selecting blocks 310 to 340 can be configured to output one among the first to fourth amplified data signals 'damp1' to 'damp4' as first to fourth selection data signals 'dsel1' to 'dsel4', respectively.

The first to fourth data input drivers 410 to 440 can be configured to receive the first to fourth selection data signals 'dsel1' to 'dsel4' and to transmit them to first to fourth global Input/Output lines GIO1 to GIO4, respectively.

Figure 1:
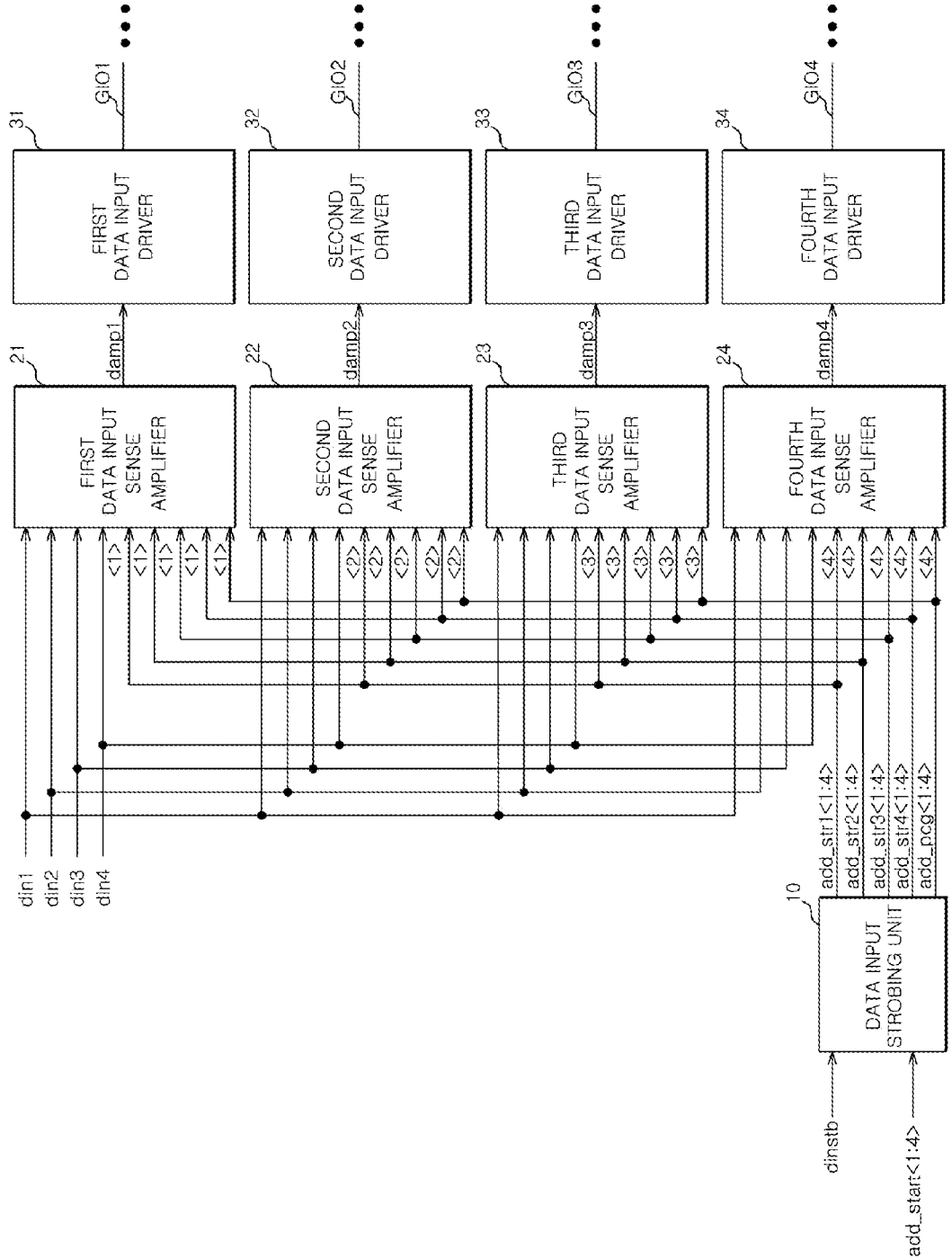
FIG. 1 is a block diagram illustrating the structure of an exemplary data input circuit of a semiconductor memory apparatus.

That is, the data input circuit 100 illustrated in FIG. 1 can be configured so that the first to fourth data input sense amplifiers 210 to 240 do not receive the first to fourth starting addresses 'add_start<1:4>'. Accordingly, each of the first to fourth data input sense amplifiers 210 to 240 only amplifies the input data signals 'din1'-'din4'. Meanwhile, the data input circuit 100 can include the first to fourth data selecting blocks 310 to 340 in order to transmit the amplified data to the corresponding global Input/Output lines. The precharge operation of the first to fourth data input sense amplifiers 210 to 240 can be performed by the data input strobe signal 'dinstb', and thus, an additional precharge signal is not used.

The first to fourth starting addresses 'add_start<1:4>' can be input to the first to fourth data selecting blocks 310 to 340. Further, all of the first to fourth amplified data signals 'damp1' to 'damp4' can be input to each of the first to fourth data selecting blocks 310 to 340. Then, the first to fourth data selecting blocks 310 to 340 can be configured to output a predetermined combination of the first to fourth amplified data signals 'damp1' to 'damp4' according to the first to fourth starting addresses 'add_start<1:4>'.

That is, in the data input circuit 100 illustrated in FIG. 1, address signal lines, which are used to transmit input data to corresponding global Input/Output lines, are not as complicated as in conventional circuits. The data input sense amplifier can be configured to receive only one-bit data, and an additional precharge signal does not need to be generated. Accordingly, it is possible to drastically reduce an area that is occupied by the data input circuit.

Figure 3:
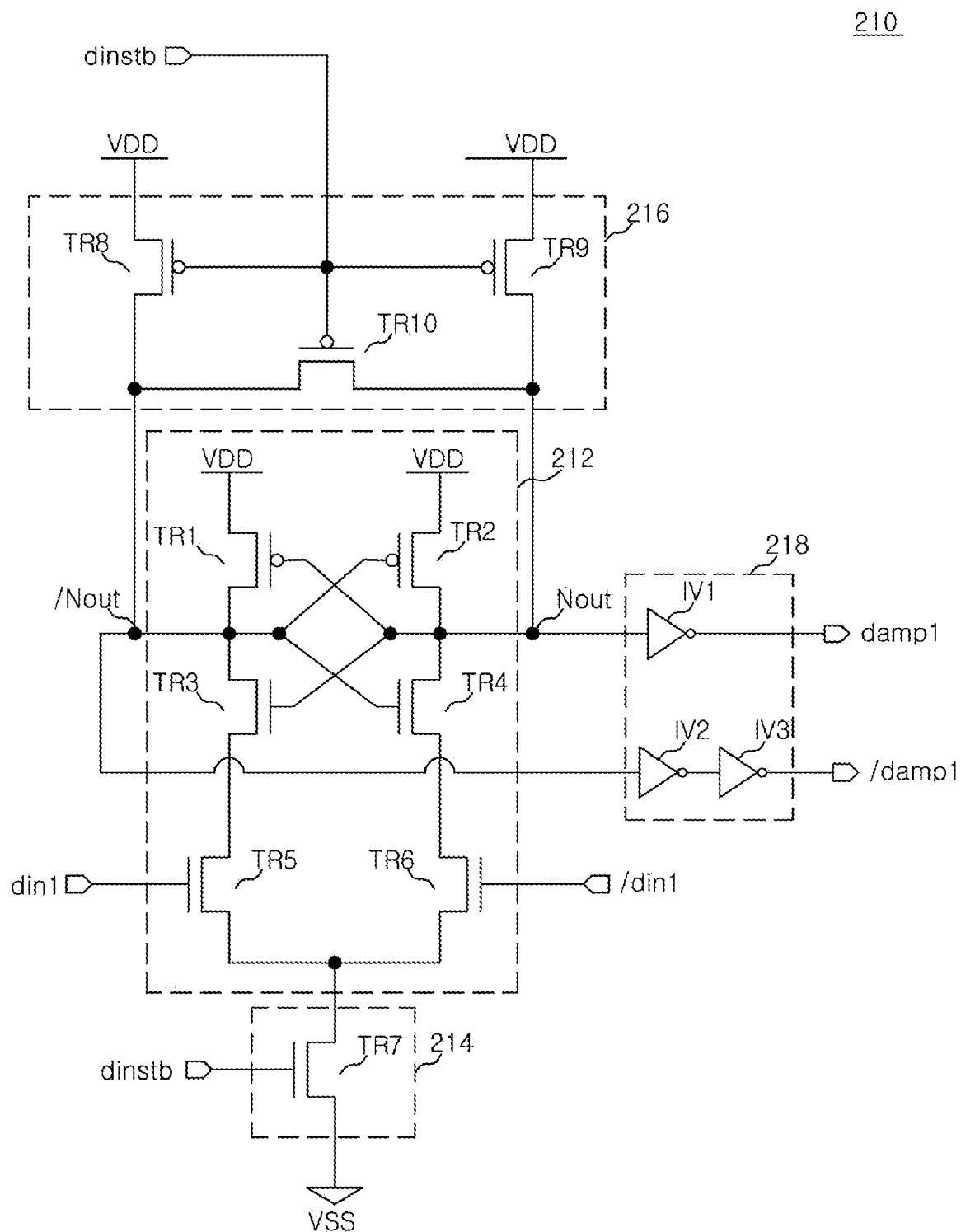
FIG. 3 is a circuit diagram illustrating the structure of a first data sense amplifier that can be included in the circuit shown in FIG. 2.

Referring to FIG. 3, the first data input sense amplifier 210 can include an amplifying unit 212, a control unit 214, a precharge unit 216, and an output unit 218. In FIG. 3, since the first to fourth data input sense amplifiers have the same structure, only the structure and operation of the first data input sense amplifier is described to avoid repetitive description. In this case, each of the input data signals and the amplified data signals can be composed of a pair of data signals.

The amplifying unit 212 can be configured to perform a differential amplifying operation on a first input data signal pair 'din1' and '/din1' to output the amplified data to a pair of output nodes Nout and /Nout. The amplifying unit 212 can be composed of first to sixth transistors TR1 to TR6.

The first transistor TR1 can include a gate that is connected to a positive output node Nout, a source that is applied with an external power supply voltage VDD, and a drain that is connected to a negative output node /Nout. The second transistor TR2 can include a gate that is connected to the negative output node /Nout, a source that receives the external power supply voltage VDD, and a drain that is connected to the positive output node Nout. The third transistor TR3 can include a gate that is connected to the positive output node Nout and a drain that is connected to the negative output node /Nout. The fourth transistor TR4 can include a gate that is connected to the negative output node /Nout and a drain that is connected to the positive output node Nout. The fifth transistor TR5 can include a gate that receives the first positive input data signal 'din1', a drain that is connected to a source of the third transistor TR3, and a source that is connected to the control unit 214. The sixth transistor TR6 can include a gate that receives the first negative input data signal '/din1', a drain that is connected to a source of the fourth transistor TR4, and a source that is connected to the control unit 214.

The control unit 214 can be configured to activate the amplifying unit 212 in response to the data input strobe signal 'dinstb'. The control unit 214 can include a seventh transistor TR7. The seventh transistor TR7 can include a gate that receives the data input strobe signal 'dinstb', a drain that is connected to the common source of the fifth and sixth transistors TR5 and TR6 of the amplifying unit 212, and a source that is connected to the ground.

The precharge unit 216 can be configured to precharge a pair of output nodes Nout and /Nout in response to the data input strobe signal 'dinstb'. The precharge unit 216 can include eighth to tenth transistors TR8 to TR10. The eighth transistor TR8 can include a gate that receives the data input strobe signal 'dinstb', a source that is supplied with the external power supply voltage VDD, and a drain that is connected to the negative output node /Nout. The ninth transistor TR9 can include a gate that receives the data input strobe signal 'dinstb', a source that is supplied with the external power supply voltage VDD, and a drain that is connected to the positive output node Nout. The tenth transistor TR10 can include a gate that receives the data input strobe signal 'dinstb'. The tenth transistor TR10 can be provided between the pair of output nodes Nout and /Nout.

The output unit 218 can be configured to receive the signals of the pair of output nodes Nout and /Nout to generate the first amplified data signal pair 'damp1' and '/damp1'. The output unit 218 can include a first inverter IV1, a second inverter IV2, and a third inverter IV3. The first inverter IV1 can inversely drive the signal applied to the positive output node Nout to output the first positive amplified data signal 'damp1'. The second and third inverters IV2 and IV3 can non-inversely drive the signal applied to the negative output node /Nout to output the first negative amplified data signal '/damp1'.

In the first data input sense amplifier 210 that has the above-described structure, if the data input strobe signal 'dinstb' is disabled, then the seventh transistor TR7 of the control unit 214 is turned off. Thus, the operation of the amplifying unit 212 is not driven. At this time, all of the eighth to tenth transistors TR8 to TR10 of the precharge unit 216 can be turned on. Therefore, a high-level voltage is applied to the pair of output nodes Nout and /Nout. In this case, the first positive amplified data signal 'damp1' goes to a low level and the first negative amplified data signal '/damp1' becomes a high level.

Meanwhile, if the data input strobe signal 'dinstb' is enabled, then the seventh transistor TR7 is turned on, and the eighth to tenth transistors TR8 to TR10 are turned off. Therefore, the amplifying unit 212 performs an amplifying operation on the first input data pair signal 'din1' and '/din1'. In this case, if the first positive input data signal 'din1' is at a high level, then the first amplified data pair signal 'damp1' and '/damp1' go low 1. If the first positive input data 'din1' is at a low level, then the first amplified data pair 'damp1' and '/damp1' becomes a high level.

The first data input sense amplifier 210 does not need the precharge signal, and can be configured to control the amplifying operation according to the data input strobe signal 'dinstb'. Since the first data input sense amplifier 210 only amplifies one input data, the circuit structure of the first data input sense amplifier 210 is simplified.

Figure 4:
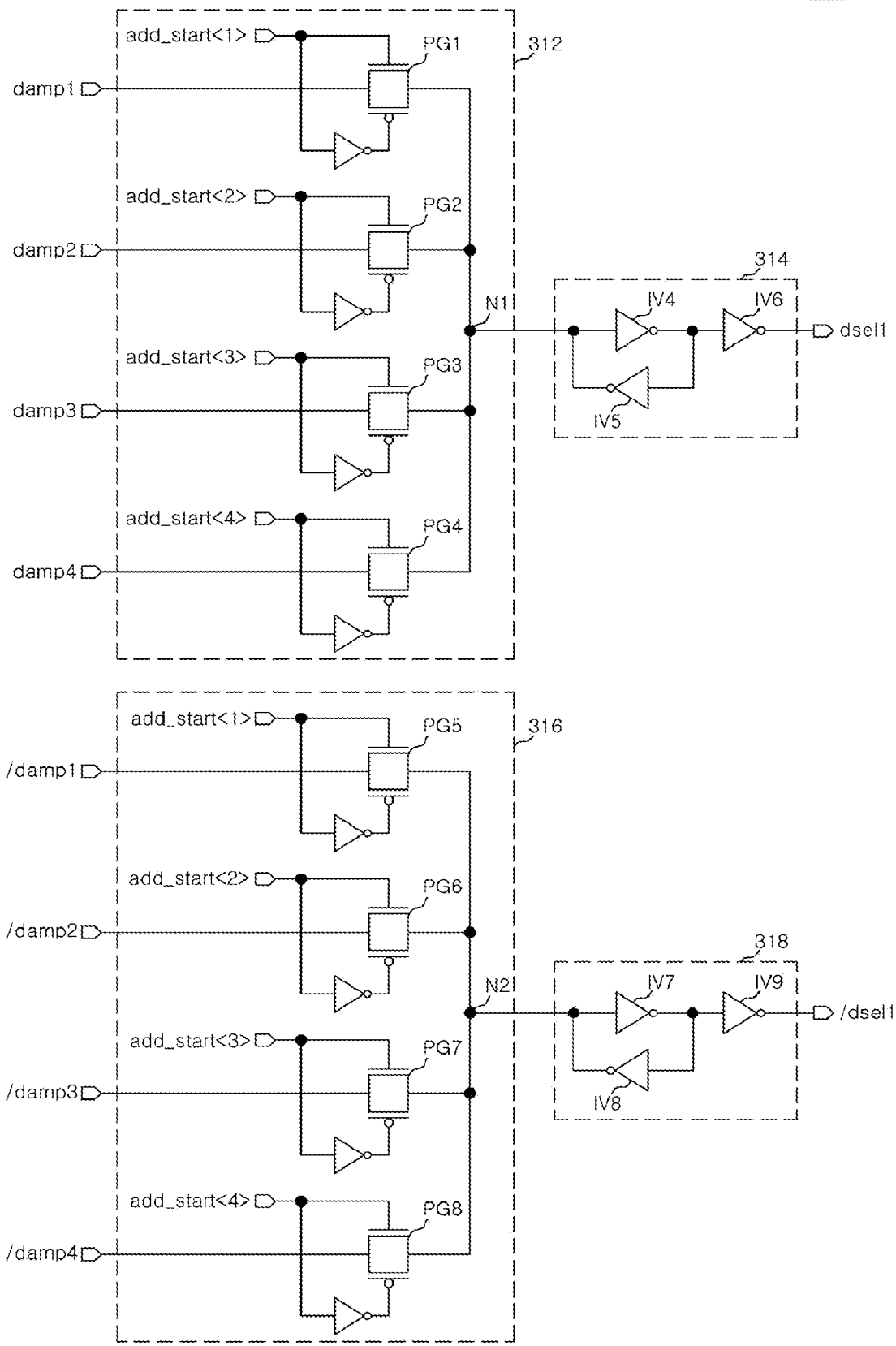
FIG. 4 is a circuit diagram illustrating the structure of a first data selecting block that can be included in the circuit shown in FIG. 2.

FIG. 4 is a diagram illustrating in detail the structure of the first data selecting block shown in FIG. 2. Since the first to fourth data selecting blocks have the same structure, the structure and operation of the first data selecting block is only described to avoid repetitive description. In this example, each of the amplified data signals and the selection data signals can be composed of a pair of data signals.

The first data selecting block 310 can include a first switching unit 312, a first latch unit 314, a second switching unit 316, and a second latch unit 318.

The first switching unit 312 can selectively pass the first to fourth positive amplified data signals 'damp1' to 'damp4' in response to the first to fourth starting addresses 'add_start<1:4>'. The first latch unit 314 can be configured to latch and drive data that is transmitted from the first switching unit 312, and output the first positive selection data 'dsel1'. The second switching unit 316 can selectively pass the first to fourth negative amplified data signals '/damp1' to '/damp4' in response to the first to fourth starting addresses 'add_start<1:4>'. The second latch unit 318 can be configured to latch and drive data that is transmitted from the second switching unit 316, and output the first negative selection data signal '/dsel1'.

In this case, the first switching unit 312 can comprise first to fourth pass gates PG1 to PG4. The first pass gate PG1 can transmit the first positive amplified data signal 'damp1' to a first node N1 in response to the first starting address 'add_start<1>'. The second pass gate PG2 can transmit the second positive amplified data signal 'damp2' to the first node N1 in response to the second starting address 'add_start<2>'.

The third pass gate PG3 can transmit the third positive amplified data signal 'damp3' to the first node N1 in response to the third starting address 'add_start<3>'. The fourth pass gate PG4 can transmit the fourth positive amplified data signal 'damp4' to the first node N1 in response to the fourth starting address 'add_start<4>'.

The first latch unit 314 can include a fourth inverter IV4, a fifth inverter IV5 that forms a latch structure together with the fourth inverter IV4, and a sixth inverter IV6. In this case, the fourth inverter IV4 can receive the signal that is applied to the first node N1, and the sixth inverter IV6 can receive an output signal of the fourth inverter IV4 and output the first positive selection data signal 'dsel1'.

The second switching unit 316 can comprise fifth to eighth pass gates PG5 to PG8. The fifth pass gate PG5 can transmit the first negative amplified data signal '/damp1' to a second node N2 in response to the first starting address 'add_start<1>'. The sixth pass gate PG6 can transmit the second negative amplified data signal '/damp2' to the second node N2 in response to the second starting address 'add_start<2>'. The seventh pass gate PG7 can transmit the third negative amplified data signal '/damp3' to the second node N2 in response to the third starting address 'add_start<3>'. The eighth pass gate PG8 can transmit the fourth negative amplified data signal '/damp4' to the second node N2 in response to the fourth starting address 'add_start<4>'.

The second latch unit 318 can include a seventh inverter IV7, an eighth inverter IV8 that forms a latch structure together with the seventh inverter IV7, and a ninth inverter IV9. In this case, the seventh inverter IV7 can receive the signal that is applied to the second node N2, and the ninth inverter IV9 can receive an output signal of the seventh inverter IV7 and output the first negative selection data signal '/dsel1'.

By using the above-described structure, in response to the first to fourth starting addresses 'add_start<1:4>' that are selectively enabled, the first data selecting block 130 can output one of the first to fourth positive amplified data signals 'damp1' to 'damp4' as the first positive selection data signal 'dsel1', and one of the first to fourth negative amplified data signals '/damp1' to '/damp4' as the first negative selection data signal '/dsel1'.

Thus, in the first data selecting block 310, the first to fourth positive amplified data signals 'damp1' to 'damp4' and the first to fourth negative amplified data signals '/damp1' to '/damp4' can be sequentially matched with the first to fourth starting addresses 'add_start<1:4>'. However, in the second to fourth data selecting blocks 320 to 340, the first to fourth positive amplified data signals 'damp1' to 'damp4' and the first to fourth negative amplified data '/damp1' to '/damp4' can be matched with the first to fourth starting addresses 'add_start<1:4>', in contrast with the method used in the first data selecting block 310.

For example, in the second data selecting block 320, the second, third, fourth, and first positive amplified data signals 'damp2', 'damp3', 'damp4', and 'damp1', and the second, third, fourth, and first negative amplified data signals '/damp2', '/damp3', '/damp4', and '/damp1' can be sequentially matched with the first to fourth starting addresses 'add_start<1:4>'. In the third data selecting block 330, the third, fourth, first, and second positive amplified data signals 'damp3', 'damp4', 'damp1', and 'damp2', and the third, fourth, first, and second negative amplified data signals '/damp3', '/damp4', '/damp1', and '/damp2' can be sequentially matched with the first to fourth starting addresses 'add_start<1:4>'. In the fourth data selecting block 340, the fourth, first, second, and third positive amplified data signals 'damp4', 'damp1', 'damp2', and 'damp3', and the fourth, first, second, and third negative amplified data signals '/damp4', '/damp1', '/damp2', and '/damp3' can be sequentially matched with the first to fourth starting addresses 'add_start<1:4>'.

Accordingly, data bit combinations of the first to fourth positive selection data signals 'dsel1' to 'dsel4' and the first to fourth negative selection data signals '/dsel1' to '/dsel4' can vary according to which bit of the first to fourth starting addresses 'add_start<1:4>' is enabled.

Figure 5:
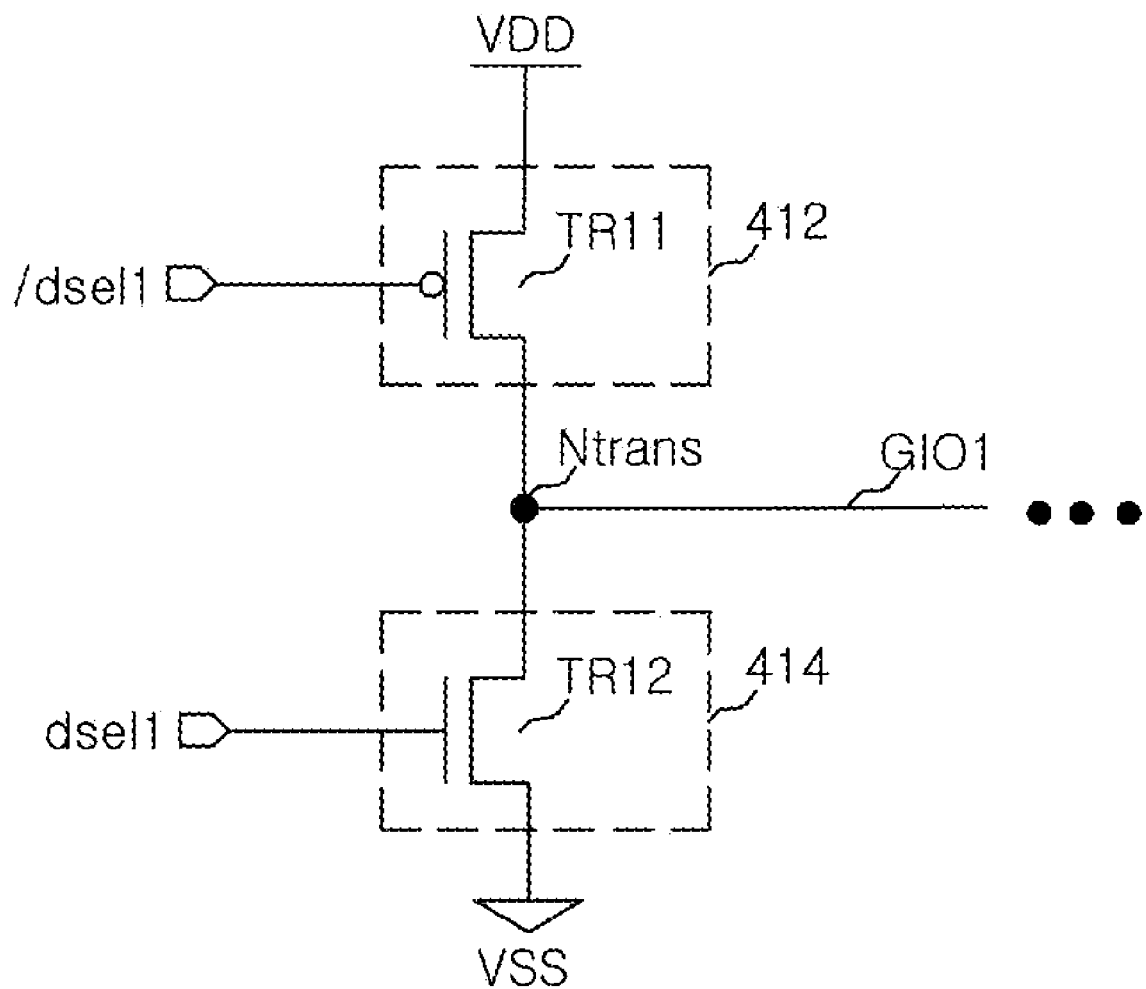
FIG. 5 is a circuit diagram illustrating the structure of a first data input driver that can be included in the circuit shown in FIG. 2.

FIG. 5 is a diagram illustrating the structure of the first data input driver shown in FIG. 2. Since the first to fourth data input drivers have the same structure, the structure and operation of the first data input driver is only described to avoid repetitive description. In this case, the selection data signal can be composed of a pair of data signals.

Referring to FIG. 5, the first data input driver 410 can include a data transmission node Ntrans, a pull-up unit 412, and a pull-down unit 414. The data transmission node Ntrans can be configured to transmit data to the first global Input/Output line GIO1. The pull-up unit 412 can be configured to pull up the data transmission node Ntrans in response to the first negative selection data '/dsel1'. The pull-down unit 414 can be configured to pull down the data transmission node Ntrans in response to the first positive selection data 'dsel1'.

The pull-up unit 412 can include an eleventh transistor TR11. The eleventh transistor TR11 can include a gate that receives the first negative selection data '/dsel1', a source that is supplied with the external power supply voltage VDD, and a drain that is connected to the pull-down unit 414 and the data transmission node Ntrans.

The pull-down unit 414 can include a twelfth transistor TR12. The twelfth transistor 412 can include a gate that receives the first positive selection data 'dsel1', a drain that is connected to the pull-up unit 412 and the data transmission node Ntrans, and a source that is connected to the ground.

The first data input driver 410 can be configured to drive and transmit the first selection data signal pair 'dsel1' and '/dsel1' to the first global Input/Output line GIO1.

In a state where the data input strobe signal 'dinstb', which is input to the first to fourth data input sense amplifiers 210 to 240, is disabled, the first to fourth positive amplified data signals 'damp1' to 'damp4' become low, and the first to fourth negative amplified data '/damp1' to '/damp4' become high. Then, when the data input strobe signal 'dinstb' is enabled and the first to fourth input data signal pairs 'din1' and '/din1' to 'din4' and '/din4' are respectively input to the first to fourth data input sense amplifiers 210 to 240, the first to fourth amplified data pairs 'damp1' and '/damp1' to 'damp4' and '/damp4' have predetermined values according to the first to fourth input data pairs 'din1' and '/din1' to 'din4' and '/din4'.

Then, the first to fourth amplified data signal pairs 'damp1' and '/damp1' to 'damp4' and '/damp4' form predetermined combinations according to enabled bits of the first to fourth starting addresses 'add_start<1:4>'. The predetermined combinations as the first to fourth selection data signal pairs 'dsel1' and '/dsel1' to 'dsel4' and '/dsel4' are respectively transmitted to the first to fourth data input drivers 410 to 440. Each of the first to fourth data input drivers 410 to 440 can be configured to transmit high-level data signals to the corresponding global Input/Output line when a pair of input selection data is at a low level. Meanwhile, each of the first to fourth data input drivers 410 to 440 can be configured to transmit low-level data signals to the corresponding global Input/Output line when a pair of input selection data is at a high level.

As described above, in a data input circuit configured in accordance with the embodiments described herein, each sense amplifier does not receive the starting address and can be configured to only amplify one input data bit. In addition, each sense amplifier does not use a separate precharge signal, and can perform a precharge operation using the data input strobe signal. Such a data input circuit can include a plurality of data selecting blocks to form various combinations of data according to the starting addresses. Therefore, the structure of each sense amplifier can be simplified and the number of address signal lines can be reduced. As a result, the area of the data input circuit can be reduced. Therefore, such a data input circuit increases an area margin in the semiconductor memory apparatus and enables a high degree of integration of the semiconductor memory apparatus.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data input circuit of a semiconductor memory apparatus, the data input circuit comprising:
   a plurality of data input sense amplifiers, each of which amplifies input data in response to a data input strobe signal and generates amplified data; and
   a data selecting block that selectively outputs a plurality of amplified data output from the plurality of data input sense amplifiers in response to starting addresses.

2. The data input circuit of claim 1, wherein the plurality of data input sense amplifiers perform a precharge operation in response to the data input strobe signal.

3. The data input circuit of claim 2, wherein each of the plurality of data input sense amplifiers includes:
   an amplifying unit that performs a differential amplifying operation on the input data and applies the amplified data to an output node;
   a control unit that activates the amplifying unit in response to the data input strobe signal;
   a precharge unit that precharges the output node in response to the data input strobe signal; and
   an output unit that drives a signal applied to the output node and outputs the amplified data.

4. The data input circuit of claim 1, wherein the starting addresses include plural-bit address signals, and the data selecting block outputs one of the plurality of amplified data according to an enabled address signal among the plural-bit address signals.

5. The data input circuit of claim 4, wherein the data selecting block includes;
   a switching unit that selectively passes one of the plurality of amplified data in response to the plural-bit address signals; and
   a latch unit that latches and drives data transmitted from the switching unit.

6. The data input circuit of claim 1, further comprising:
   a data input driver that drives the data output from the data selecting block and transmits the data to a global Input/output line.

7. The data input circuit of claim 6,
   wherein the data input driver includes:
   a data transmission node that transmits data to the global Input/output line;
   a pull-up unit that pulls up the data transmission node in response to the data output from the data selecting block; and
   a pull-down unit that pulls down the data transmission node in response to the data output from the data selecting block.

8. A data input circuit of a semiconductor memory apparatus, the data input circuit comprising:
   a data input sense amplifier that amplifies input data in response to a data input strobe signal to generate amplified data;
   a plurality of data selecting blocks that selectively output the amplified data in response to starting addresses; and
   a plurality of data input drivers that drive a plurality of data components output from the plurality of data selecting blocks and transmits the data components to global Input/Output lines,
   wherein the data input sense amplifier performs a precharge operation in response to the data input strobe signal.

9. The data input circuit of claim 8, wherein the data input sense amplifier includes:
   an amplifying unit that performs a differential amplifying operation on the input data and applies the amplified data to an output node;
   a control unit that activates the amplifying unit in response to the data input strobe signal;
   a precharge unit that precharges the output node in response to the data input strobe signal; and
   an output unit that drives a signal applied to the output node and outputs the amplified data.

10. The data input circuit of claim 8, wherein the starting addresses include plural-bit address signals, and each of the plurality of data selecting blocks outputs the amplified data when a one-bit signal of the plural-bit address signals is enabled.

11. The data input circuit of claim 10, wherein each of the plurality of data selecting blocks includes;
    a switching unit that selectively passes the amplified data in response to the plural-bit address signal; and
    a latch unit that latches and drives data transmitted from the switching unit.

12. The data input circuit of claim 8, wherein each of the plurality data input drivers includes:
    a data transmission node that transmits data to the global Input/Output line;
    a pull-up unit that pulls up the data transmission node in response to the data output from the data selecting block; and
    a pull-down unit that pulls down the data transmission node in response to the data output from the data selecting block.

13. A data input circuit of a semiconductor memory apparatus, the data input circuit comprising:
    a first data input sense amplifier that amplifies first input data in response to a data input strobe signal and generates first amplified data;
    a second data input sense amplifier that amplifies second input data in response to the data input strobe signal and generates second amplified data;
    a first data selecting block that selectively outputs the first amplified data or the second amplified data in response to starting addresses;
    a second data selecting block that selectively outputs the first amplified data or the second amplified data in response to the starting addresses;

a first data input driver that drives data transmitted from the first data selecting block and transmits the data to a first global Input/Output line; and a second data input driver that drives data transmitted from the second data selecting block and transmits the data to a second global Input/Output line.

14. The data input circuit of claim 13, wherein the first and second data input sense amplifiers perform a precharge operation in response to the data input strobe signal.

15. The data input circuit of claim 14, wherein each of the first input data and the first amplified data is composed of in a pair of signals, and the first data input sense amplifier includes:

an amplifying unit that performs a differential amplifying operation on the first input data pair and applies the first input data pair to an output node pair;

a control unit that activates the amplifying unit in response to the data input strobe signal;

a precharge unit that precharges the output node pair in response to the data input strobe signal; and an output unit that drives signals applied to the output node pair and outputs the first amplified data pair.

16. The data input circuit of claim 14, wherein each of the second input data and the second amplified data is composed of a pair of signals, and the second data input sense amplifier includes:

an amplifying unit that performs a differential amplifying operation on the second input data pair and applies the second input data pair to an output node pair;

a control unit that activates the amplifying unit in response to the data input strobe signal;

a precharge unit that precharges the output node pair in response to the data input strobe signal; and an output unit that drives signals applied to the output node pair and outputs the second amplified data pair.

17. The data input circuit of claim 13, wherein the first data selecting block outputs the first amplified data or the second amplified data as first selection data in response to the starting addresses, the second data selecting block outputs the first amplified data or the second amplified data as second selection data in response to the starting addresses, and the first selection data and the second selection data are composed of combinations of the first and second amplified data according to logical values of the starting addresses, the combination of the first selection data is different from the combination of the second selection data.

18. The data input circuit of claim 17, wherein each of the first and second amplified data and the first selection data is composed of a pair of signals, and the first data selecting block includes:

a first switching unit that selectively passes first and second positive amplified data in response to the starting addresses;

a first latch unit that latches and drives data transmitted from the first switching unit and outputs first positive selection data;

a second switching unit that selectively passes first and second negative amplified data in response to the starting addresses; and a second latch unit that latches and drives data transmitted from the second switching unit and outputs first negative selection data.

19. The data input circuit of claim 17, wherein each of the first and second amplified data and the second selection data is composed of a pair of signals, and the second data selecting block includes:

a first switching unit that selectively passes first and second positive amplified data in response to the starting addresses;

a first latch unit that latches and drives data transmitted from the first switching unit and outputs second positive selection data;

a second switching unit that selectively passes first and second negative amplified data in response to the starting addresses; and a second latch unit that latches and drives data transmitted from the second switching unit and outputs second negative selection data.

20. The data input circuit of claim 18, wherein the first data input driver includes:

a data transmission node that transmits data to the first global Input/Output line;

a pull-up unit that pulls up the data transmission node in response to the first negative selection data; and a pull-down unit that pulls down the data transmission node in response to the first positive selection data.

21. The data input circuit of claim 19, wherein the second data input driver includes:

a data transmission node that transmits data to the second global Input/Output line;

a pull-up unit that pulls up the data transmission node in response to the second negative selection data; and a pull-down unit that pulls down the data transmission node in response to the second positive selection data.

22. A data input method of a semiconductor memory apparatus, the data input method comprising:

amplifying a plurality of input data in response to a data input strobe signal thereby generating a plurality of amplified data;

generating one data combination from the plurality of amplified data in response to starting addresses; and transmitting the data combination through global Input/Output lines, wherein the generating of the plurality of amplified data includes performing a precharge operation in response to the data input strobe signal.

23. The data input method of claim 22, wherein the generating of the one data combination includes:

outputting the first amplified data or the second amplified data as first selection data in response to the starting addresses; and outputting the first amplified data or the second amplified data as second selection data and driving the second selected data, and the first selection data and the second selection data are composed of different combinations of the first and second amplified data according to logical values of the starting addresses.

* * * * *